United States Patent

[11] 3,579,058

[72] Inventor Dietrich Armgarth
Dresden, Germany
[21] Appl. No. 702,754
[22] Filed Feb. 2, 1968
[45] Patented May 18, 1971
[73] Assignee Arbeitsstelle Fur Molekularelektronik
Dresden, Germany

[54] SEMICONDUCTOR MODULE AND METHOD OF ITS PRODUCTION
7 Claims, 12 Drawing Figs.

[52] U.S. Cl. .......... 317/235, 29/576, 317/101
[51] Int. Cl. .......... H01l 19/00
[50] Field of Search .......... 317/234, 235, 235/22, 101; 29/576

[56] References Cited
UNITED STATES PATENTS

| | | | |
|---|---|---|---|
| 3,393,349 | 7/1968 | Huffman | 317/101 |
| 3,401,450 | 9/1968 | Godejahn | 317/234X |
| 3,412,295 | 11/1968 | Grebene | 317/234 |
| 3,412,296 | 11/1968 | Grebene | 317/234 |

*Primary Examiner*—James D. Kallam
*Attorney*—Nolte and Nolte

ABSTRACT: A multilayer junction semiconductor device includes one semiconductive layer of a type of conductivity provided on its upper surface with a recess of a rectangular cross section. Vertical walls and corners of this recess are coated with a thin insulating layer, while the bottom thereof is open. Another semiconductive layer of an opposite type of conductivity is disposed within this recess, so that the critical PN junction area extends perpendicularly to the insulated vertical walls.

The method of producing this device is based on the semiconductive layer inside said recess serving as an initial temporary substratum on which subsequent layers are precipitated.

Patented May 18, 1971 3,579,058

2 Sheets-Sheet 1

INVENTOR
DIETRICH ARMGARTH

Patented May 18, 1971

3,579,058

2 Sheets-Sheet 2

INVENTOR
DIETRICH ARMGARTH

SEMICONDUCTOR MODULE AND METHOD OF ITS PRODUCTION

BACKGROUND OF THE INVENTION

1. Field of the Invention

This invention relates to an integrated semiconductor device, and particularly, to a microminiature semiconductor functional block or micromodule having an increased breakdown voltage and to a method of producing a semiconductor device of this type.

2. Prior Art

Semiconductor microminiature multielement functional blocks or micromodules have been manufactured in different ways to attain sufficient insulation between individual functional elements. However, the known methods have a drawback in that the resulting semiconductor devices have a relatively low breakdown voltage, caused by the rounded edges of the critical PN junctions.

Moreover, in the known methods for producing a reverse biased PN junction or a $SiO_2$ layer as insulation means, the PN junction barrier at each element causes parasitic capacitances against the grounded substratum, and parasitic path resistance between respective elements, which parasitic phenomena deteriorate the frequency response characteristics of the circuit, of the functional elements. Although it is possible to reduce the path resistances, it is not known how to avoid the parasitic capacitances, for which reason the upper frequency limit of the integrated circuits is lower than that of circuits having discrete functional elements, provided that the geometric dimensions of the functional elements in both circuits are mutually comparable. By reducing the geometric dimensions of respective elements, it is possible in the case of an integrated circuit, to also reduce the parasitic capacitances. However, this expedient will cause an increase in the path resistances. Besides, undesired parasitic transistors and four-layer structures may occur on the substratum, which parasitic structures influence disadvantageously the reliability of the device. According to known methods of producing insulations by means of $SiO_2$ layers such as disclosed for instance in R. M. Warner "Integrated Circuits, Design, Principles and Fabrication," Motorola Series in Solid-state Electronics 1965, McGraw-Hill Book Company, N.Y.–the parasitic transistor–and four-layer effects may be completely eliminated. Even if these methods are technologically more laborious, they make it possible to attain a complete insulation, since the individual functional elements, that is, the areas of structural elements, may be completely surrounded by a $SiO_2$ layer. Consequently, the parasitic capacitances against the substratum may be reduced, and parasitic path resistances, mostly the collector path resistances, diminished.

As mentioned above, none of the hitherto existing insulation producing methods achieves a higher breakdown voltage, since the curved edges on the PN junctions are preserved. Moreover, these known methods employ a selective base diffusion, whereby a number of operatively inefficient functional elements may occur, through the pores of the oxide layer.

In view of these and other problems in the art, the primary object of this invention is, therefore, to increase the quality of semiconductor devices.

Another object of this invention is to simplify the process of production of such semiconductor devices, more particularly of semiconductor devices having a microminiature integrated configuration.

A further object of the invention is to increase the production reliability and output of such semiconductor devices.

A further object of this invention is to provide a semiconductor device, preferably an integrated circuit module having individually arranged functional elements, wherein the curves on the edges of the PN junctions are avoided and thereby the breakdown voltage is increased. The parasitic capacitances against the substratum as well as the collector path resistances are reduced, and during the fabrication of such device, the forming of additional nonconductive layers prior to base diffusion is avoided.

SUMMARY OF THE INVENTION

According to the invention, a semiconductor device is provided having at least one semiconductor functional element and is able to operate at an increased breakdown voltage. Moreover, the semiconductor device of this invention introduces reduced levels of parasitic capacitances and resistance paths. The semiconductor device of this invention includes a substratum in which the functional element is embedded. A lower semiconductor layer portion of one conductivity type is provided with a recess of rectangular cross section. An intermediate nonconductive layer is disposed over the vertical walls and bottom wall of the recess, and an upper semiconductive layer portion of an opposite conductivity type is disposed within the coated recess to define a PN junction between the lower and upper semiconductor.

The invention also provides for a method to produce the above-described semiconductor device.

Still further objects and advantages of the present invention will be apparent during the course of the following part of the specification, wherein the details of the production steps and construction of presently preferred embodiment are described in the reference to the accompanying drawings, in which:

DESCRIPTION OF THE PREFERRED EMBODIMENTS

Figure 1E:
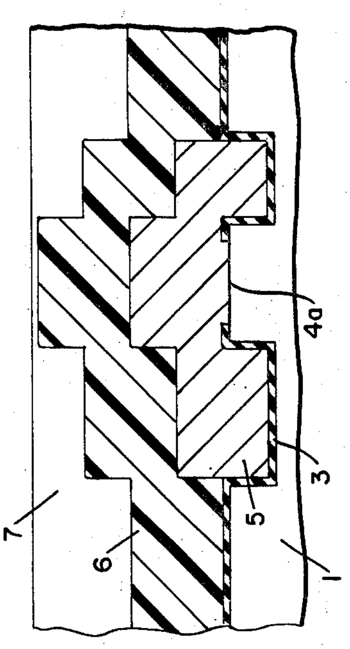
FIGS. 1*a*—1*g* illustrate a preferred sequence of steps of the production method of a semiconductor device of this invention, the semiconductor device being illustrated in a vertical section.
Figure 1F:
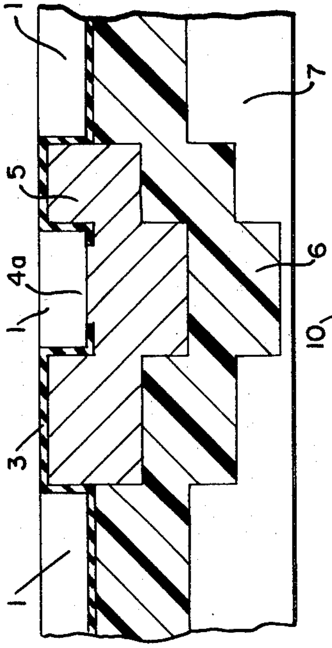
Figure 1G:
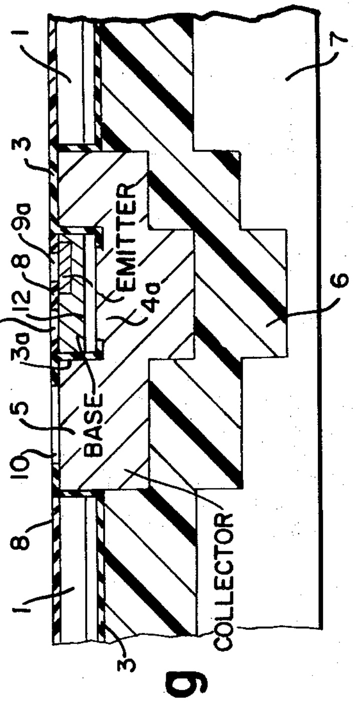
Figure 1A:
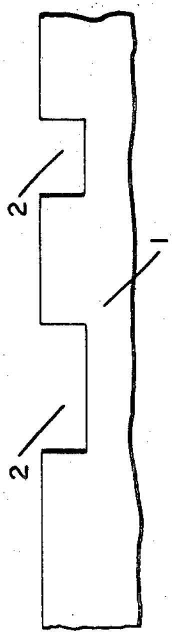
Figure 1B:
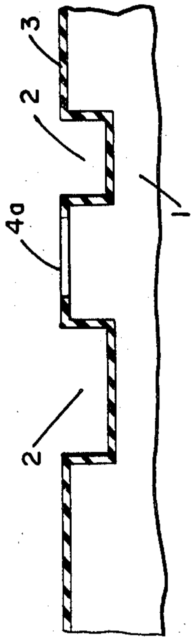
Figure 1C:
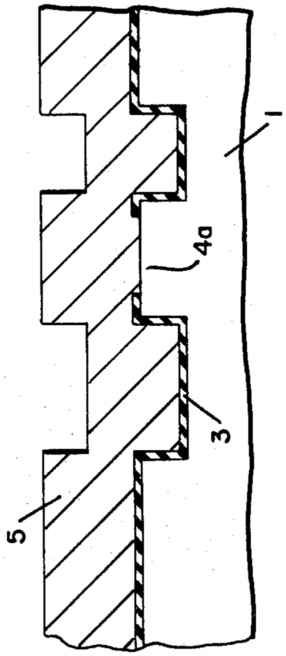
Figure 1D:
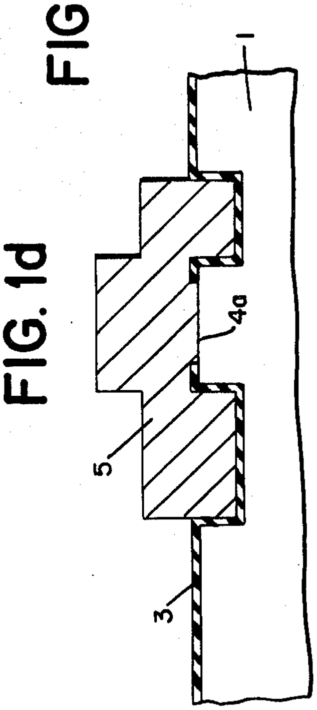

In FIG. 1*a*, there is shown an *n*-type silicon semiconductor body 1, forming an initial horizontal substratum, which, in a known manner is provided on its upper surface with a number of vertical recesses 2 having a rectangular cross section. The entire surface area is then coated with a thin nonconductive $SiO_2$ (silicon dioxide) layer 3. In a further step the nonconductive layer is partially removed from the region 4*a* between two recesses, where an active portion of a functional element is to be provided (FIG. 1*b*). The next step consists in precipitating a very highly doped *n*-type semiconductive material over the whole horizontal surface area to form a uniformly deposited semiconductive layer 5 of uniform thickness which, in the region 4*a* against the silicon semiconductor body 1 converts into a monocrystalline and on the nonconductive $SiO_2$ layer 3 converts into a polycrystalline form (FIG. 1*c*). As shown in FIG. 1*d*, the highly doped semiconductive layer 5 is then removed, to the level of the nonconductive $SiO_2$ layer 3, from the regions where according to the circuit design, no active functional elements are to be located. The following step shown in FIG. 1*e* provides a uniformly thick nonconductive $SiO_2$ layer 6 to cover the highly doped semiconductive material 5. Layer 6 may be homogenuously precipitated either over the large surface area or selectively against respective islands. Another polycrystalline layer 7 of a semiconductive material (silicon) is then deposited on the layer 6 and, the upper surface thereof is leveled preferably by means of lapping.

In this phase of the production process, the entire structure is turned upside down so that the lapped polycrystalline silicon layer 7 becomes a substratum of the device. Thereupon the semiconductive body 1 is partially removed by lapping and etching as low as the uppermost horizontal surface of the embedded nonconductive layer 3, as illustrated in FIG. 1*f*.

FIG. 1*g* illustrates a completed semiconductor device of this invention which is finished by the following steps.

A portion of the initial substratum 1, respectively the remnant regions of the semiconductor body 1 are redoped to the desired depth to have a *p*-type of conductivity and in accordance with the desired dislocation of respective functional elements. This can be carried out preferably by means of a large area diffusion process which simultaneously produces an additional nonconductive $SiO_2$ layer 8 which acts as a protection layer. The layer 8 is then provided with apertures 9*a* and serves as a masking layer for emitter diffusion and, subsequently, with apertures 10 for terminal contacts, respectively, for providing electrical connections to areas of individual functional elements. In FIG. 1*g* there is moreover shown the total structure of a resulting functional element. It is to be noted, that the highly doped material of the semiconductor layer 5 extends from a contact region 10 as far as to the proper active region 4*a* of the functional element—such as a junction transistor having a collector, a base and an emitter, as shown in this embodiment, so that the resulting collector path resistances have an extremely low value. The monocrystalline material 1 may have an increased resistance of approximately 1 ohm cm, in contrast to values obtained by hitherto employed materials. Accordingly, lower junction barrier capacitances and higher breakdown voltages in this region may be attained. Due to the embedded mesa structure of the active functional element, the critical PN junction 12, between the base and collector material, extends perpendicularly to a vertical portion 3*a* of the nonconductive layer 3. By means of this structure, rounded edges of the PN junction 12 are eliminated, thereby resulting in an increase of the breakdown voltage. Simultaneously, parasitic capacitances at the junction barriers are substantially diminished and the processing steps of providing an oxide window for the base diffusion may be omitted. A further advantage of this process is that the upper surface of the semiconductor device, except the emitter region, results in a homogenuous plane. After the emitter diffusion has been accomplished, the thickness of the $SiO_2$ protection layer 8 may be increased by an additional coating of $SiO_2$, which lowers the capacity of the electrical connections.

The above-described fabrication process is only one example of the many possibilities of how to manufacture the semiconductive device of this invention. The same result may be obtained for instance, according to the following version of the method of this invention illustrated in FIGS. 2*a*—2*e*.

Figure 2D:
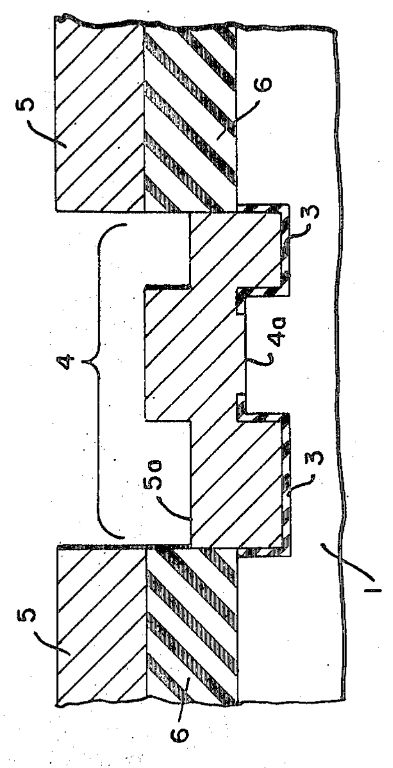
FIGS. 2*a*—2*e* illustrate one possible variation of the production method of this invention.
Figure 2E:
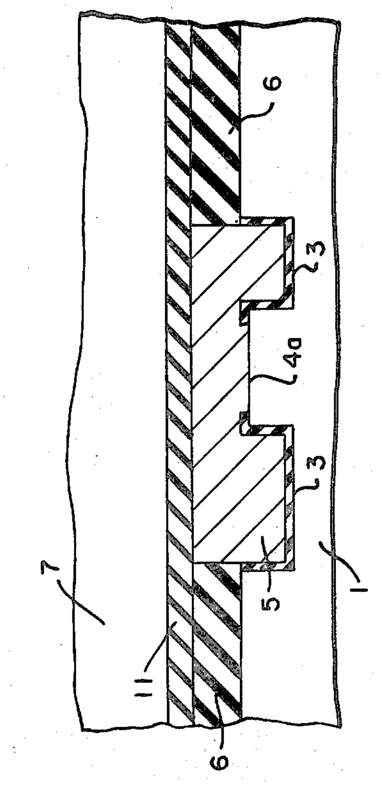
Figure 2A:
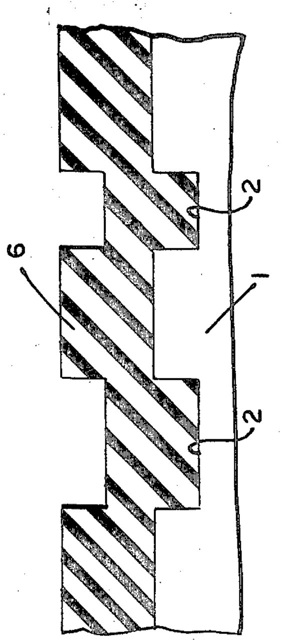
Figure 2B:
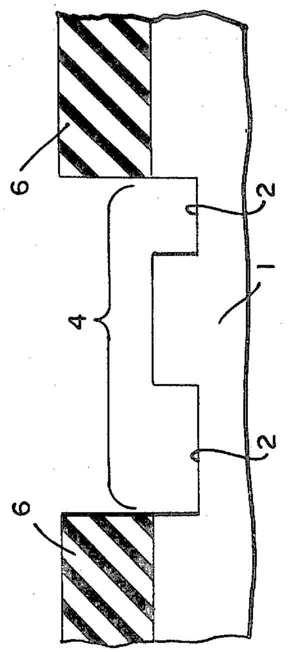

By contract to the manufacturing steps shown in FIGS. 1*a*—1*e*, in the method illustrated in FIGS. 2*a*—2*e*, a relatively thick nonconductive $SiO_2$ layer 6 is deposited on the semiconductive body 1 and within recesses 2, as a first step (FIG. 2*a*). The layer 6 is then removed from the profiled area 4 in which an active functional element is to be created as shown in FIG. 2*b*.

Figure 2C:
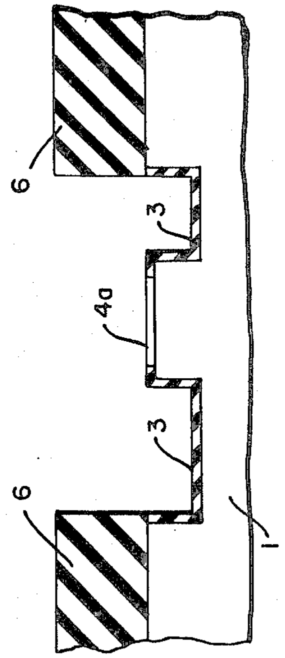

As shown in FIG. 2*c*, the resulting open surface of the semiconductive body 1 in the region 4 is coated with a thin, nonconductive $SiO_2$ layer 3 which will be partially removed from the central region 4*a* in the profiled area 4 reserved for the active element. This central region 4*a* may, if desired, be covered by an auxiliary protective layer prior to the depositing of the think $SiO_2$ layer 3.

In the next step, shown in FIG. 2*d*, a thick, highly doped semiconductive layer 5 is uniformly precipitated on the whole upper surface of the above-described substratum. Layer 5 in the following step (shown in FIG. 2*e*) is leveled together with the upper section of the thick nonconductive $SiO_2$ layer 6 lapping in one plane as deep as the lowest surface level 5*a* in the profiled area 4. The plane 5*a* is subsequently coated with a relatively thin nonconductive intermediate $SiO_2$ layer 11 on which a relatively thick, polycrystalline silicon layer 7 is precipitated. The polycrystalline layer 7 is again leveled by means of lapping to form a horizontal plane. Turned upside down, the semiconductive body 1 is leveled accordingly to serve as a substratum for the following steps which correspond to those as described in the first example in FIGS. 1*f* and 1*g*.

While the instant invention has been shown and described herein in what is conceived to be the most practical and preferred embodiment, it is recognized that departures may be made therefrom within the scope of the invention which is therefore not to be limited to the details disclosed herein, but it is to be accorded the full scope of the appended claims.

With the processes described above it is also possible to realize discrete diodes and transistors with high breakdown voltages and low collector path resistances.

I claim:

1. A semiconductor device having at least one semiconductor functional element with an increased breakdown voltage, comprising substratum means for embedding said functional element including a lower semiconductive layer portion of one type of conductivity, said lower semiconductor layer portion having a recess of a rectangular cross section therein, an intermediate nonconductive layer covering vertical walls and the periphery of the bottom of said recess, whereby the center portion of the bottom of said recess is not covered by said nonconductive layer, an upper semiconductive layer portion of a conductivity type opposite to the conductivity type of said lower semiconductor layer portion disposed within said recess and joining said lower semiconductor layer portion in said uncovered bottom portion of said recess to define a PN junction extending between said layer portions perpendicularly to said nonconductive layer portion covering said vertical nonconducting walls to form rectangular edges.

2. The semiconductor device according to claim 1 further comprising a plurality of functional elements, the upper surfaces of said functional elements being leveled into a plane and provided with an additional nonconductive protective layer having apertures therein adapted to receive terminals and electrical connections of said functional elements.

3. The device according to claim 1, wherein said upper layer portion further comprises a diffused layer of a different type of conductivity than said upper layer to thereby create a transistor.

4. A method of producing a semiconductor multilayer device having at least one functional semiconductor element with an increased breakdown voltage, comprising the steps of:

providing a number of vertical recesses of a rectangular cross section in the upper surface of a semiconductive body of one conductivity type, coating the resulting recessed surface area with a uniformly thin nonconductive layer, removing a central portion of said nonconductive thin layer in the top surface region of said semiconductive body between two adjacent recesses to define an active area, whereby the periphery of said top surface region remains coated with said nonconductive layer, coating the resulting said surface area with a uniformly thick layer of a highly doped semiconductive material of said one type of conductivity, removing said highly doped material as deep as said nonconductive thin layer from a surface region of the resulting surface area which does not overlie said two adjacent recesses and said active area, coating the resulting upper surface area with a uniformly thick nonconductive layer, coating said thick nonconductive layer with a thick polycrystalline layer to form a substratum, and leveling the latter surface of said substratum into a plane, leveling the lower surface of said semiconductive body as deep as the embedded nonconductive thin layer, redoping the portion of said semiconductive body exposed by said last-mentioned leveling step to have the opposite type of conductivity to a determined depth, whereby a PN junction is formed in said remaining semiconductive body which extends perpendicularly to the vertical portions of said thin nonconductive layer, and producing an additional nonconductive protection layer on the exposed surface of said semiconductive body, and forming an aperture in said additional nonconductive protection layer for making electrical connections therein.

5. A method of producing a semiconductor multilayer device having at least one functional semiconductor element with an increased breakdown voltage, comprising the steps of providing a number of vertical recesses of a rectangular cross section in the upper surface of a semiconductive body of one conductivity type, coating the resulting recessed surface area with a uniformly thin nonconductive layer, removing a central portion of said thin nonconductive layer overlying the upper surface of said semiconductive body between two adjacent recesses to define an active area of the functional element, coating the resulting surface area overlying said two adjacent recesses and active area with a uniformly thick layer of a highly doped semiconductive material of said one type of conductivity to define an area where a functional element is to be located, coating the resulting upper surface area with a uniformly thick nonconductive layer coating said thick nonconductive layer with a thick polycrystalline layer and leveling the latter into a plane, leveling the lower surface of said semiconductor body as deep as the embedded nonconductive thin layer, redoping the portion of the semiconductive body exposed by said last-mentioned leveling step to have the opposite type of conductivity to a determined depth, whereby a *p-n* junction is formed in the remaining semiconductive body which extends perpendicularly to the vertical portions of said thin nonconductive layer, and producing an additional nonconductive thin layer on the exposed surface of said semiconductive body, and forming an aperture in said additional nonconductive protection layer for receiving electrical connections.

6. A method of producing a semiconductor multilayer device having at least one functional semiconductor element with an increased breakdown voltage, comprising the steps of providing a number of vertical recesses of a rectangular cross section in the upper surface of a semiconductive body, coating the resulting surface area with a uniformly thick nonconductive layer, removing said thick nonconductive layer from the profiled surface region overlying two consecutive recesses and the surface area between said recesses to define an area of a functional element, coating the open profiled surface region with a thin nonconductive layer and removing the latter only in the central region of said surface area between said recesses, coating the resulting upper surface area with a uniformly thick layer of a highly doped semiconductive material of one type of conductivity, levelling said thick nonconductive layer and said highly doped semiconductive layer in one plane, coating the resulting plane with a uniformly thin nonconducting intermediate layer, coating the intermediate layer with a thick semiconductive layer and levelling the latter into a plane, levelling the lower surface of the semiconductive body as deep as to the embedded thin nonconductive layer, redoping the portion of the semiconductive body exposed by said last-mentioned levelling step to have the opposite type of conductivity to a determined depth, whereby a PN junction is formed in said remaining semiconductive body which extends perpendicularly to the vertical portions of said thin nonconductive layer, producing an additional nonconductive protection layer on the upper surface of the latter, and forming an aperture in said protection layer for receiving electrical connections.

7. A method of producing a semiconductive device comprising the steps of providing a silicon semiconductive body with a number of vertical recesses of rectangular cross section to serve as a temporary substratum, insulating the profiled area between two adjacent recesses by means of a thin nonconductive layer of a silicon compound, removing said thin nonconductive layer from a portion of the region intermediate the recesses, precipitating a thick highly doped semiconductive material onto said profiled area, insulating the upper surface of the precipitated material by means of a thick nonconductive layer and depositing a thick polycrystalline semiconductive layer thereupon, levelling said polycrystalline layer to a plane to serve as a final substratum of the device, levelling said temporary substratum as deep as to the thin nonconductive layer, redoping said temporary substratum exposed by said last-mentioned levelling step, by a diffusion process, to have the opposite conductivity to a determined depth, whereby a PN junction is formed in said temporary substratum extending perpendicularly to the vertical portions of said thin nonconductive layer, and whereby a nonconductive protection layer is simultaneously formed on the surface of said redoped temporary substratum, and forming an aperture in said protection layer for making electrical connections to said redoped temporary substratum.